(12) United States Patent
Shin (10) Patent No.: US 6,396,310 B2
(45) Date of Patent: May 28, 2002

(54) CURRENT SENSE AMPLIFIERS ENABLING AMPLIFICATION OF BIT LINE VOLTAGES PROVIDED BY BIT LINE SENSE AMPLIFIERS

(75) Inventor: Sang-woong Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/903,128

(22) Filed: Jul. 11, 2001

(30) Foreign Application Priority Data

Jul. 18, 2000 (KR) .............................. 00-40990

(51) Int. Cl.⁷ .................................................. G11C 7/06
(52) U.S. Cl. ................................................ 327/55; 327/57
(58) Field of Search .................... 327/51–57; 365/203, 365/205

(56) References Cited

U.S. PATENT DOCUMENTS

| | | | | |
|---|---|---|---|---|
| 5,132,576 A | * | 7/1992 | Park | .............................. 327/51 |
| 5,619,467 A | * | 4/1997 | Sim | .............................. 327/52 |
| 6,281,713 B1 | * | 8/2001 | Kim | .............................. 327/55 |
| 6,326,815 B1 | * | 12/2001 | Sim et al. | ........................ 327/55 |

* cited by examiner

*Primary Examiner*—Toan Tran
(74) *Attorney, Agent, or Firm*—Myers Bigel Sibley & Sajovec (57) ABSTRACT

Integrated circuit memory devices according to the present invention include a current sense amplifier having first and second cross-coupled sensing transistors. First and second data lines are electrically coupled to the source of the first sensing transistor and the source of the second sensing transistor, respectively. The current sense amplifier includes a first load transistor that has a source electrically connected to a drain of the first sensing transistor and a gate of the second sensing transistor and a second load transistor is included that has a source electrically connected to a drain of the second sensing transistor and a gate of the first sensing transistor. A switching transistor is responsive to an enable signal and has a source electrically coupled to a drain of the first load transistor and a drain of said second load transistor. A first load circuit provides a variable impedance across the source and the drain of the first load transistor in response to at least a first sense signal.

24 Claims, 6 Drawing Sheets

CURRENT SENSE AMPLIFIERS ENABLING AMPLIFICATION OF BIT LINE VOLTAGES PROVIDED BY BIT LINE SENSE AMPLIFIERS

RELATED APPLICATION

This application claims the benefit of Korean Application No. 2000-40990, filed Jul. 18, 2000, the disclosure of which is hereby incorporated herein by reference.

BACKGROUND OF THE INVENTION

The present invention generally relates to integrated circuit devices, and more particularly, to current sense amplifiers.

Semiconductor memory devices may include a plurality of memory cells. Data may be stored in the memory cells and/or read from the memory cells. Typically, data stored in the memory cells is provided to a bit line sense amplifier via a bit line or a plurality of bit lines, so that the voltage level of the bit line or lines may be sensed and amplified. A word line may be enabled in response to a /RAS command. When a word line is enabled, data stored in all of the memory cells connected to the word line may be transmitted to bit lines corresponding to the respective memory cells. During transmission, the voltage levels of the bit lines may increase or decrease. Complementary bit lines correspond to adjacent memory cells. Complementary bit lines may maintain a voltage level that is pre-charged to an initial bit line voltage.

Accordingly, predetermined voltage differences may be generated between the bit lines and the complementary bit lines connected to bit line sense amplifiers. During operation of the bit line sense amplifiers, the voltage difference between the bit lines and the corresponding complementary bit lines may be amplified. Some of the output lines of the bit line sense amplifiers may be selected by a column selection circuit and connected to data input output lines. The column selection circuit may be activated in response to a /CAS active command. The time between a /RAS active command and a /CAS active command may be referred to as "tRCD", i.e. a /RAS to /CAS delay time. The outputs of the bit line sense amplifiers transmitted to the data input output lines may also be sensed and amplified by data line sense amplifiers, for example, current sense amplifiers, and then output to a plurality of pads via a series of output buffers.

Now referring to FIG. 1, a block diagram illustrating part of the above-described semiconductor memory device will be described. Data of a bit line BL and a complementary bit line /BL may be coupled to a bit line sense amplifier 110 and may be transmitted to a pair of data input output lines DIO and /DIO, respectively, in response to a column selection signal CSL. The pair of data input output lines DIO and /DIO are connected to a current sense amplifier 150 via an input output MUX 140. A data line sense amplifier, for example, current sense amplifier 150, may sense and amplify the current of the data input output line pair DIO and /DIO and may determine a voltage level for the data input output line pair DIO and /DIO. The input output MUX 140 determines which memory block to connect the current sense amplifier 150 to when the current sense amplifier 150 is shared by at least two memory blocks.

Predetermined amounts of current i1 and i2 flow on the data input output line pair DIO and /DIO from a load transistor 130, which may be, for example, a current source. For example, when the bit line sense amplifier 110 outputs a bit line BL at a logic high voltage level and a complementary bit line /BL at a logic low voltage level, a current that flows through a first load transistor 131 in response to a loading signal LOAD is typically smaller than a current that flows through a second load transistor 132. This is due to the fact that the drain to source current Ids of the first load transistor 131 is smaller than the Ids of the second load transistor 132 as the drain to source voltage Vds of the first load transistor 131 is smaller than the Vds of the second load transistor 132. Current flowing through the first load transistor 131 and current flowing through the second load transistor 132 may be applied to the data input output line DIO and the complementary data input output line /DIO, respectively.

Now referring to FIG. 2, a circuit diagram of the current sense amplifier of FIG. 1 will be described. The current sense amplifier 150 may include sensing transistors 201 and 202, load resistors 203 and 204 and a switching transistor 205. The sensing transistors 201 and 202 may have similar electrical characteristics, and their sources are connected to the pair of data input output lines DIO and /DIO, respectively. The gate and drain of the sensing transistor 201 are cross-connected to the drain and gate of the sensing transistor 202, respectively, as shown. The drains of the sensing transistors 201 and 202 are the outputs V1 and V2 of the current sense amplifier 150. The load resistors 203 and 204 may be diode-type transistors, and may have similar electrical characteristics. For example, load resistors 203 and 204 may have the same resistance. The switching transistor 205 may provide a current path for flowing certain amounts of current supplied from the load transistors 131 and 132 of FIG. 1 to a ground in response to the activation of a sensing enable signal PIOSE.

The switching transistor 205 may be turned on in response to the sensing enable signal PIOSE. Current i1 flowing on the data input output line DIO is typically different from current i2 flowing on the data input output line /DIO, due to the voltage difference between the bit line BL and the complementary bit line /BL caused by the operation of the bit line sense amplifier 110 as described in the example above. For example, when the current i1 of the data input output line DIO is smaller than the current i2 of the complementary data input output line /DIO, the first output voltage V1 decreases, while the second output voltage V2 increases. The first and second output voltage values V1 and V2 may be applied to the loading resistors 203 and 204, respectively, and may become the results of sensing made by the current sense amplifier 150. The first and second output voltage values V1 and V2 of the current sense amplifier 150 may then be transmitted to a latch-type sense amplifier and latched thereby (not shown).

Figure 3:
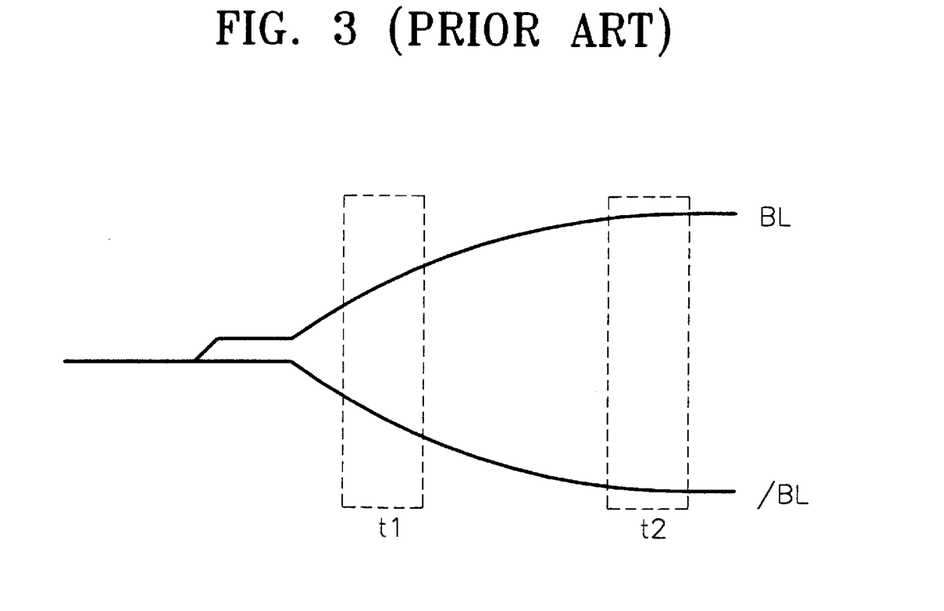
FIG. 3 is a waveform diagram of the operation of the bit line sense amplifier of FIG. 1.

The operation of the current sense amplifier 150 is typically stable once the voltage difference between the bit line BL and the complementary bit line /BL has been increased significantly by the bit line sense amplifier 110 during the time tRCD. In other words, the voltage difference between the bit line BL and the complementary bit line /BL at a time t2, shown in FIG. 3, is a stable voltage difference for the current sense amplifier 150. If, on the other hand, the current sense amplifier 150 operates at a time t1, i.e., where the voltage difference between the bit line BL and the complementary bit line /BL is not sufficiently increased by the bit line sense amplifier 110 during the time tRCD, it may take a long time for the current sense amplifier 150 to sense and amplify the current difference between the data input output line pair DIO and /DIO. If the difference between the bit line BL and the complementary bit line /BL is not sufficiently increased during the time tRCD as discussed above, the difference between the first and second output voltage values V1 and V2 may be small enough to cause the latch-type sense amplifier to malfunction.

SUMMARY OF THE INVENTION

Integrated circuit memory devices according to some embodiments of the present invention include a current sense amplifier having first and second cross-coupled sensing transistors. In some embodiments of the present invention, the sensing transistors may be PMOS transistors. First and second data lines are electrically coupled to the source of the first sensing transistor and the source of the second sensing transistor, respectively. The current sense amplifier includes a first load transistor that has a source electrically connected to a drain of the first sensing transistor and a gate of the second sensing transistor and a second load transistor is included that has a source electrically connected to a drain of the second sensing transistor and a gate of the first sensing transistor. A switching transistor is responsive to an enable signal and has a source electrically coupled to a drain of the first load transistor and a drain of said second load transistor. A first load circuit provides a variable impedance across the source and the drain of the first load transistor in response to at least a first sense signal.

In further embodiments of the present invention the first load circuit may provide first and second impedances across the source and the drain of the first load transistor when the first sense signal is inactive and active, respectively. In other embodiments, the Thevenin equivalent of the first impedance may be an open-circuit. The second impedance may be provided by a MOS diode having an anode electrically connected to the source of the first load transistor.

In still further embodiments of the present invention there may be a second load circuit that provides a variable impedance across the source and the drain of the second load transistor in response to at least a first sense signal.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather these embodiments are provided so that this disclosure will be thorough and complete, and will fully convey the scope of the invention to those skilled in the art. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout.

Now referring to FIG. 4, a current sense amplifier 400 according to embodiments of the present invention will be discussed. The current sense amplifier 400 may include sensing transistors 401 and 402, load resistors 403 and 404 and a switching transistor 407. The sensing transistors 401 and 402 may have similar electrical characteristics, and their sources are connected to the pair of data input output lines DIO and /DIO, respectively. The gate and drain of the sensing transistor 401 are cross-connected to the drain and gate of the sensing transistor 402, respectively, as shown. The drains of the sensing transistors 401 and 402 are the outputs V1 and V2 of the current sense amplifier 400. The load resistors 403 and 404 may be diode-type transistors, and may have similar electrical characteristics. For example, load resistors 403 and 404 may have the same resistance.

Figure 1:
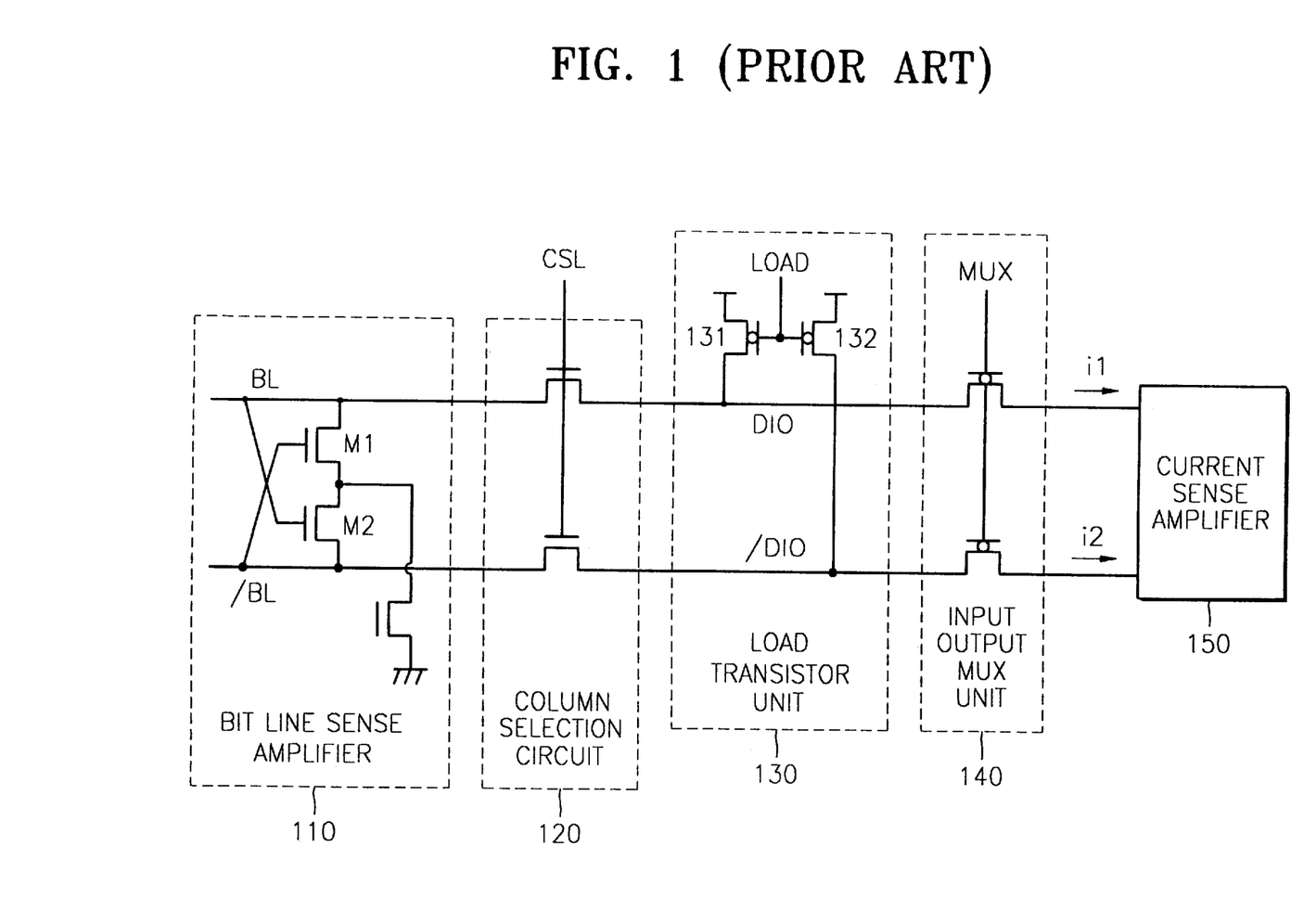
FIG. 1 is a block diagram illustrating part of a semiconductor memory device including a conventional current sense amplifier.
Figure 2:
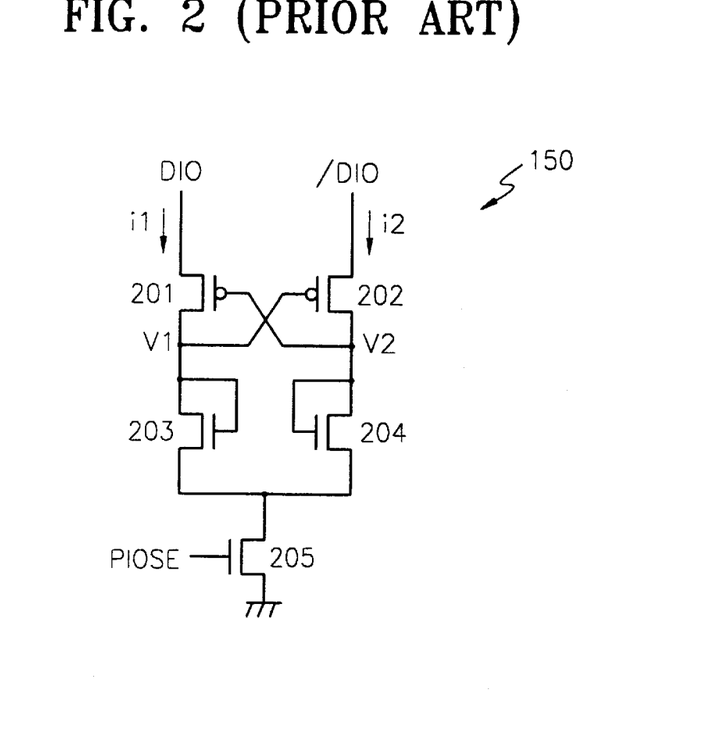
FIG. 2 is a circuit diagram of the current sense amplifier of FIG. 1.

The switching transistor 407 may provide a current path for flowing certain amounts of current supplied from the load transistors 131 and 132 of FIG. 1 to a ground in response to the activation of a sensing enable signal PIOSE. The switching transistor 407 may be turned on in response to the sensing enable signal PIOSE. Current i1 flowing on the data input output line DIO is typically different from current i2 flowing on the data input output line /DIO, due to the voltage difference between the bit line BL and the complementary bit line /BL caused by the operation of the bit line sense amplifier 110 as described in the example above. For example, when the current i1 of the data input output line DIO is smaller than the current i2 of the complementary data input output line /DIO, the first output voltage V1 decreases, while the second output voltage V2 increases.

The current sense amplifier 400 further includes a first load circuit 405, a second load circuit 406 and an equalization circuit 420, i.e. a PMOS transistor connected as shown. The equalization circuit 420 is turned on in response to the sensing enable signal. The first load circuit 405 is connected to both ends of a first load resistor 403. The second load circuit 406 is connected to both ends of a second load resistor 404. The first and second load circuits 405 and 406 may be resistive elements, for example, NMOS transistors, which may respond to a sensing signal SE1 that has a predetermined pulse width. The sensing signal SE1 may be activated to a logic high level when a bit line sense amplifier is activated.

The impedances provided by the first and second load circuits 405 and 406 may vary according to the values of the first and second output voltages V1 and V2. For example, when the first output voltage V1 decreases and the second output voltage V2 increases, the Vds of the first load circuit 405 decreases and the Vds of the second load circuit 406 increases.

Figure 5:
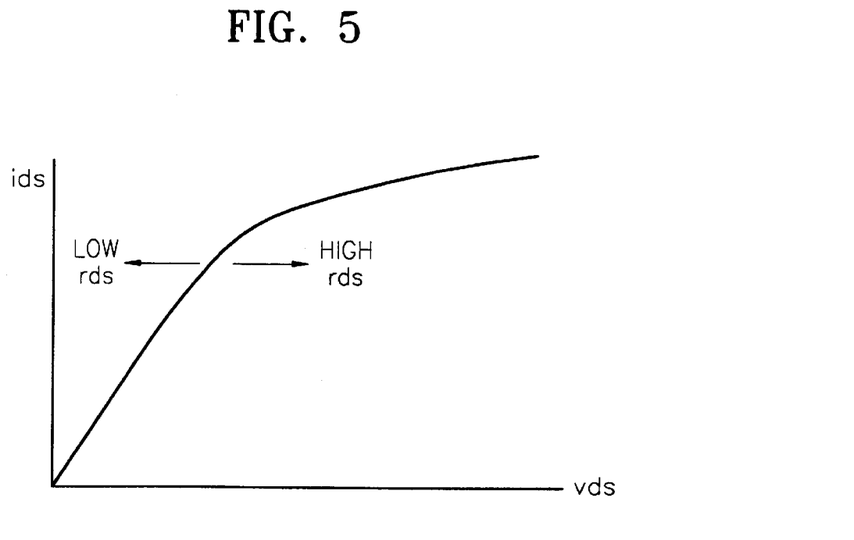
FIG. 5 is a graph illustrating electrical characteristics of conventional transistors.

FIG. 5 is a graph illustrating the electrical characteristics of an NMOS transistor. The graph illustrates that the drain-to-source resistance value (rds) increases when the drain-to-source voltage Vds increases at the boundary between a linear region and a saturation region, and the rds decreases when the Vds decreases. Thus, the resistance of the first circuit 405 may decrease responsive to a decrease in by the first output voltage V1, and the resistance of the second load circuit 406 may increase responsive to an increase in voltage V2.

Referring again to FIG. 4, the first output voltage V1, may further decrease as the resistance across the first load resistor 403 decreases due to the parallel connection of the first load resistor 403 and the first load circuit 405. The second output voltage V2, may further increase as the resistance across the second load resistor 404 increases due to the parallel connection of the second load resistor 404 and the second load circuit 406. Therefore, as V1 decreases and V2 increases, the gain of the current sense amplifier 400 may also increase.

The first and second load circuits 405 and 406 provide additional current paths responsive to the sensing signal SE1 which is asserted when a bit line sense amplifier is activated. Thus, even when the voltage difference between a bit line and a complementary bit line is not sufficiently large, the gain of the current sense amplifier may still increase due to the operation of the first and second load circuits 405 and 406. Accordingly, the current sense amplifier 400 according to embodiments of the present invention may sense and amplify voltage differences between bit lines and complementary bit lines even when the voltage difference between these bit lines is not sufficiently large, e.g., not in the t2 range of FIG. 3.

Now referring to FIG. 6A, a current sense amplifier 600 according to other embodiments of the present invention will be discussed. The current sense amplifier 600 is similar to the current sense amplifier 400 of FIG. 4, but the current sense amplifier 600 further includes first and second load circuits 630 and 640 and an equalization circuit 620, i.e. a PMOS transistor connected as shown. The equalization circuit 620 is turned on in response to the sensing enable signal. The first load circuit 630 includes a first gain control unit 605 and a first load transistor 608. Similarly, the second load circuit 640 includes a second gain control unit 609 and a second load transistor 612.

The first gain control unit 605 includes first and second control transistors 606 and 607. The first and second control transistors 606 and 607 control the impedance of the first load transistor 608 in response to first and second sensing signals SE2 and SE3, respectively. Similarly, the second gain control unit 609 may include third and fourth control transistors 610 and 611. The third and fourth control transistors 610 and 611 control the impedance of the second load transistor 612 in response to first and second sensing signals SE2 and SE3, respectively. The first sensing signal SE2 is activated to a logic high level when a bit line sense amplifier is activated, and may have a predetermined pulse width. The second sensing signal SE3, which is an inversion of the first sensing signal, is at a logic low level when the first sensing signal SE2 is at a logic high level.

The first control transistor 606 turns on when the first sensing signal SE2 is at a logic high level, and the second control transistor 607 turns off when the second sensing signal SE3 is at a logic low level. When the first control transistor 606 is on, the first load transistor 608 may act as a diode transistor like the first load resistor 603, i.e. the gate of the first load transistor 608 may essentially be coupled to the source of the first load transistor 608. The third control transistor 610 turns on when the first sensing signal SE2 is at a logic high level, and the fourth control transistor 611 turns off when the second sensing signal SE3 is at a logic low level. When the third control transistor 610 is on, the second load transistor 612 may act as a diode transistor like the second load resistor 604.

Thus, the first output voltage V1 may further decrease as the resistance across the first load resistor 603 decreases due to the parallel connection of the first load resistor 603 and the first load circuit 630. The second output voltage V2 may further increases as the resistance across the second load resistor 604 increases due to the parallel connection of the second load resistor 604 and the second load circuit 640. Therefore, as V1 decreases and V2 increases, the gain of the current sense amplifier 400 may also increase.

The first and second load circuits 630 and 640 provide additional current paths responsive to the sensing signals SE2 and SE3 when a bit line sense amplifier is activated. Thus, even when the voltage difference between a bit line and a complementary bit line is not sufficiently large, the gain of the current sense amplifier may still increase due to the operation of the first and second load circuits 630 and 640. Accordingly, the current sense amplifier 600 according to embodiments of the present invention may sense and amplify voltage differences between bit lines and complementary bit lines even when the voltage difference between these bit lines is not sufficiently large, e.g. not in the t2 range of FIG. 3.

Figure 4:
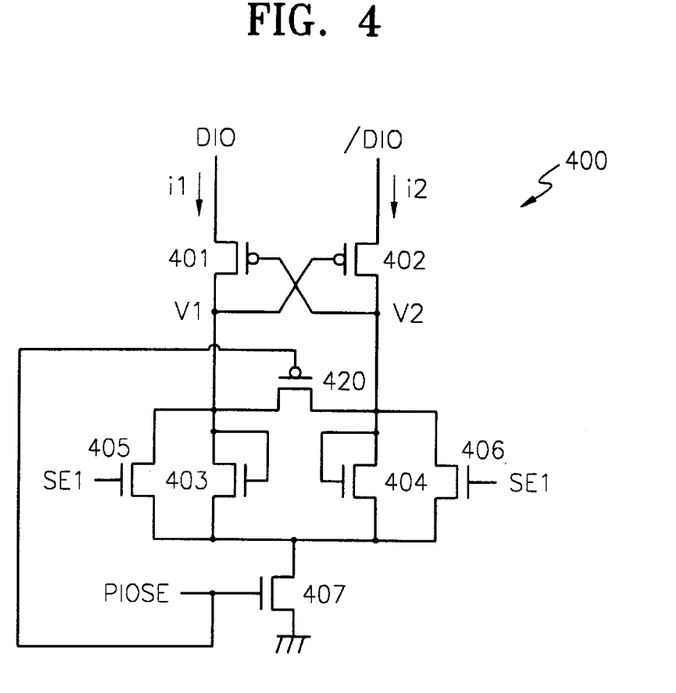
FIG. 4 is a circuit diagram of a current sense amplifier according to some embodiments of the present invention.

Furthermore, current flowing through first load transistor 608 may be less than current flowing through the first load circuit 405 of FIG. 4. Accordingly, the total amount of current flowing through a switching transistor 613 of the current sense amplifier 600 is less than that of current flowing through the switching transistor 407 of FIG. 4. Therefore, the current sense amplifier 600 may provide a larger gain, so that it can sense and amplify the voltage difference between a bit line and a complementary bit line even when the voltage difference, produced by the operation of a bit line sense amplifier, is not sufficiently large as discussed above.

Now referring to FIG. 7, a timing diagram illustrating sensing signals SE1 and SE2 of FIGS. 4, 6A and 6B will be discussed. After a signal /RAS is activated to a logic low level, and a signal /CAS is activated to a logic low level, i.e., tRCD, a predetermined bank selection pulse signal may be generated having a predetermined pulse width. When a bank readout signal of a selected bank is activated to a logic high level, the sensing signal SE1 or SE2 is asserted.

Figure 7:
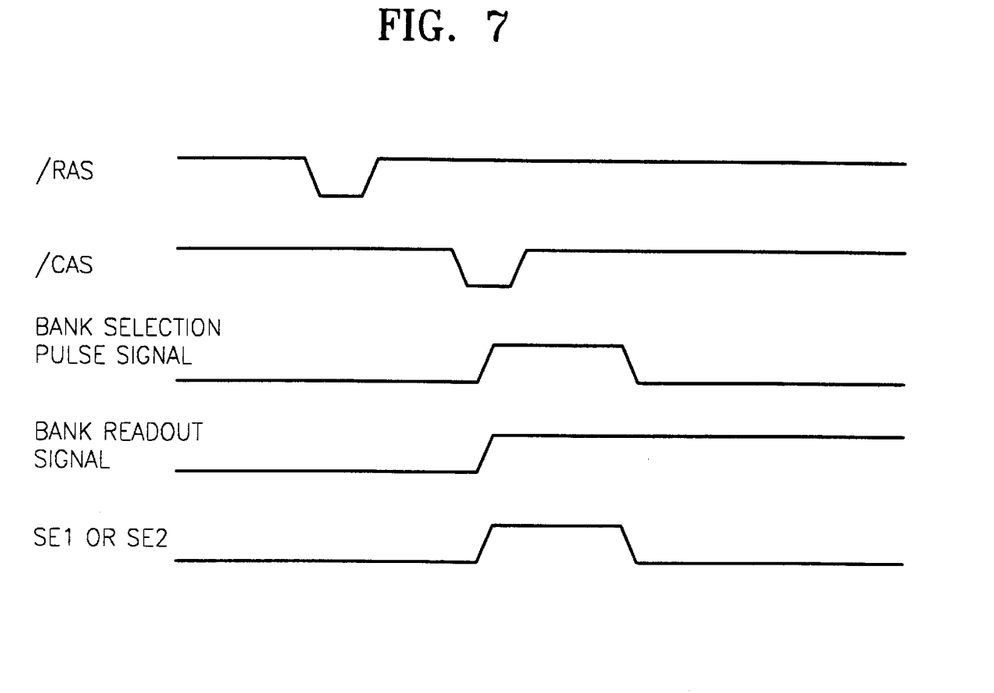
FIG. 7 is a timing diagram of the sensing signals of FIGS. 4 and 6.
Figure 8:
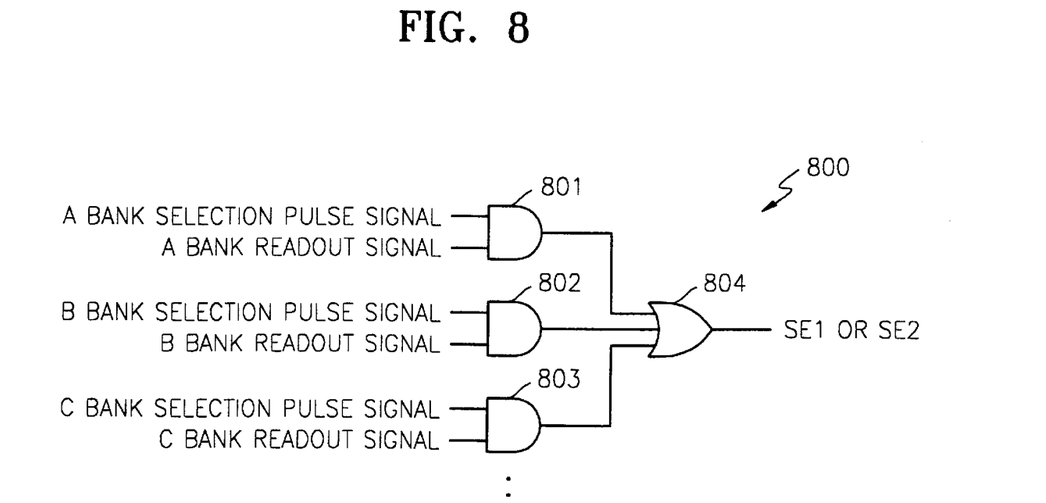
FIG. 8 illustrates a sensing signal generation circuit for generating the sensing signals of FIG. 7.

In particular, the sensing signals SE1 and SE2 may be generated using, for example, a sensing signal generation circuit illustrated in FIG. 8. Now referring to FIG. 8, a sensing signal generation circuit 800 will be discussed. The sensing signal generation circuit 800 presupposes a current sense amplifier that is shared by a plurality of memory banks. A 3-input OR gate 804 receives the output of a 2-input AND gate 801 which responds to an A bank selection pulse signal and an A bank readout signal, the output of a 2-input AND gate 802 which responds to a B bank selection pulse signal and a B bank readout signal, and the output of a 2-input AND gate 803 which responds to a C bank selection pulse signal and a C bank readout signal. In other words, the outputs of the 3-input OR gate 804 generated in response to the selection signal and read signal for each bank are the sensing signals SE1 and SE2. The sensing signal SE1 corresponds to the sensing signal of FIG. 1, and the sensing signal SE2 corresponds to the first sensing signal of FIG. 6.

Figure 6A:
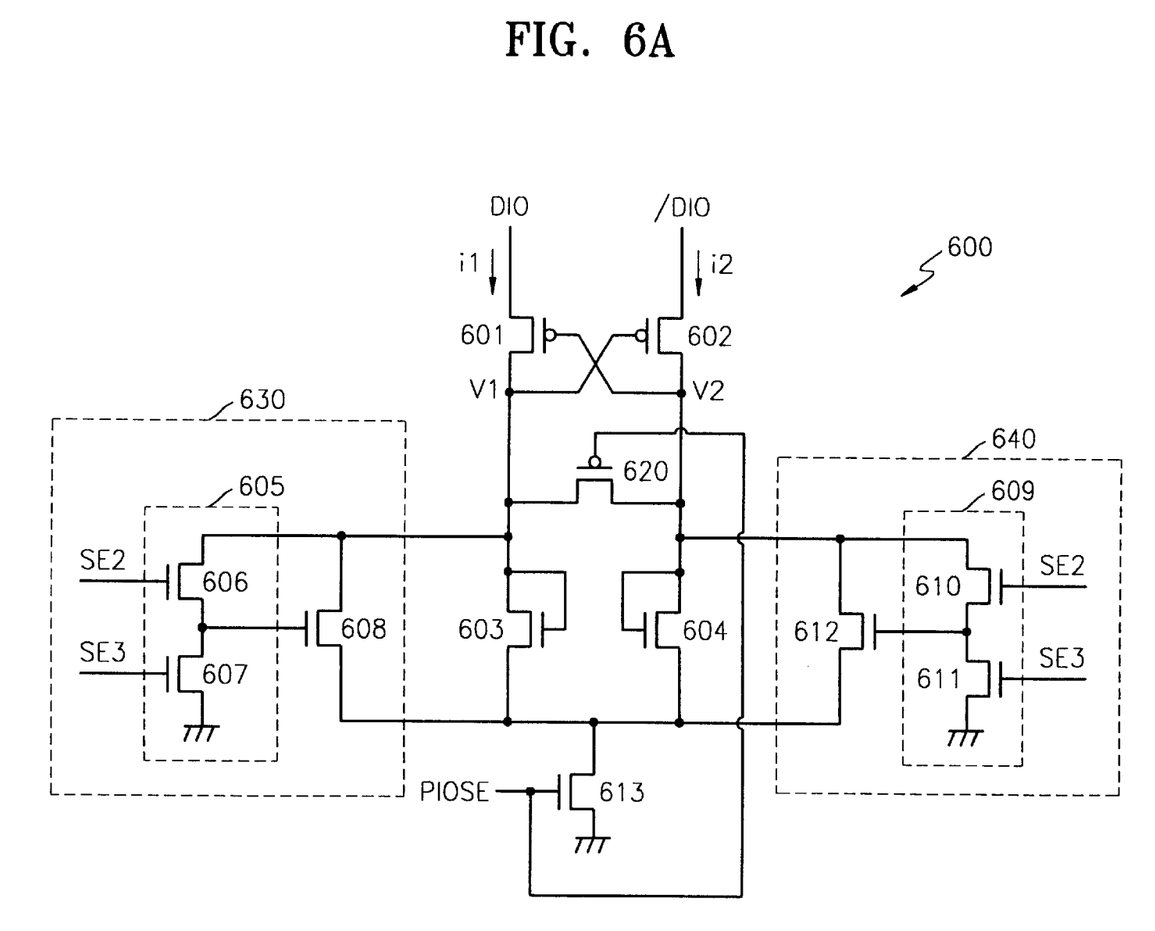
FIG. 6A is a circuit diagram of a current sense amplifier according to further embodiments of the present invention.
Figure 6B:
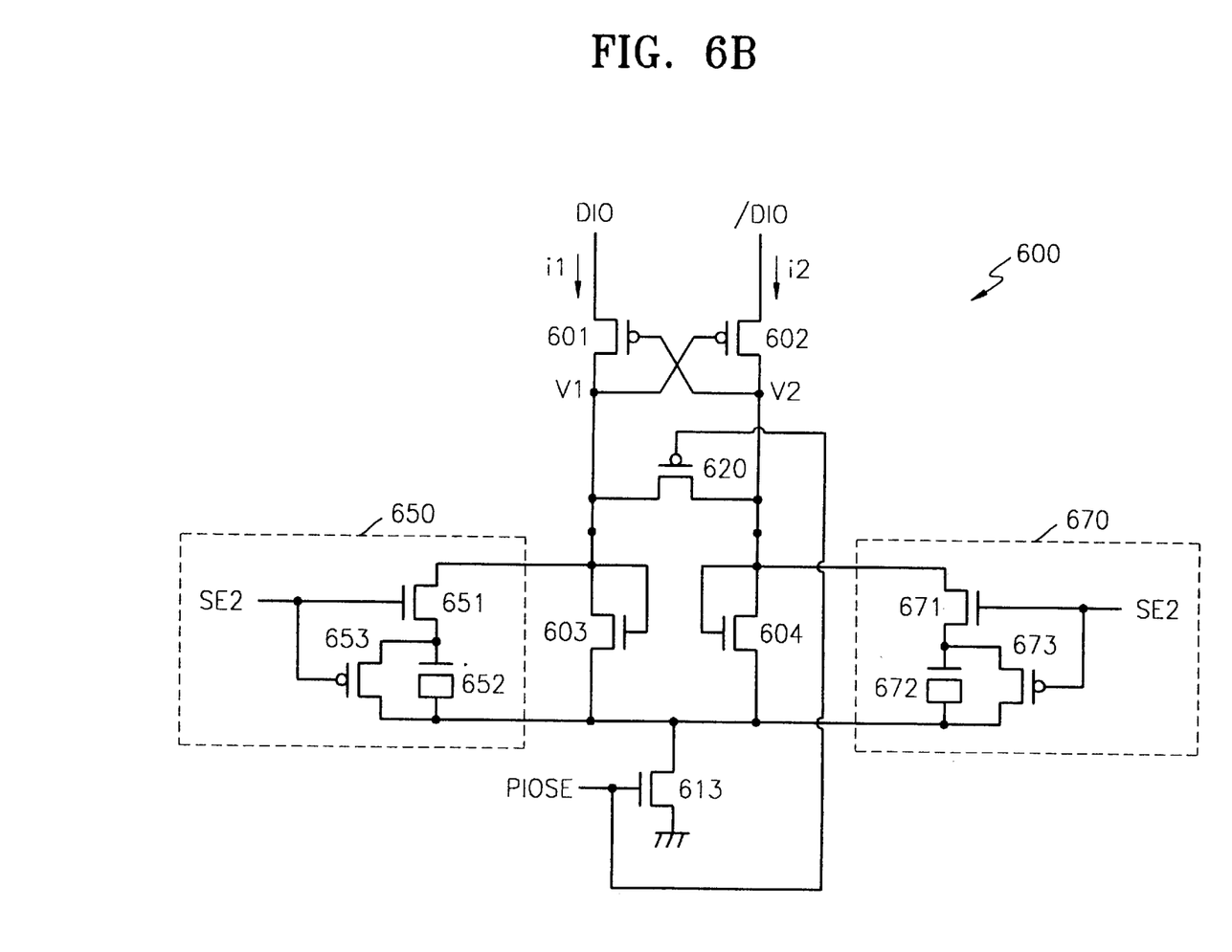
FIG. 6B is a circuit diagram of a current sense amplifier according to other embodiments of the present invention.

It will be understood that the first and second load circuits 630 and 640 are shown in FIG. 6A for exemplary purposes only and the present invention is not intended to be limited to this configuration. For example, now referring to FIG. 6B, differently configured load circuits 650 and 670 may also be employed without departing from the teachings of embodiments of the present invention. The first load circuit 650 may include a first control transistor 651, a first capacitor 652 and a first PMOS transistor 653 connected as shown. Similarly, the second load circuit 670 may include a first control transistor 671, a first capacitor 672 and a first PMOS transistor 673 also connected as shown.

It will be understood that although the sensing signal generation circuit 800 is described with respect to AND gates and OR gates, the present invention is not limited to this configuration. Any combination of Boolean operators may be used to produce the desired function.

Thus, integrated circuit memory devices according to some embodiments of the present invention provide a current sense amplifier having first and second cross-coupled sensing transistors. In some embodiments of the present invention, the sensing transistors may be PMOS transistors. First and second data lines are electrically coupled to the source of the first sensing transistor and the source of the second sensing transistor, respectively. A first load transistor is provided that has a source electrically connected to a drain of the first sensing transistor and a gate of the second sensing transistor. A second load transistor is provided that has a source electrically connected to a drain of the second sensing transistor and a gate of the first sensing transistor. A switching transistor is responsive to an enable signal and has a source electrically coupled to a drain of the first load transistor and a drain of said second load transistor. A first load circuit is included that provides a variable impedance across the source and the drain of the first load transistor in response to at least a first sense signal.

In further embodiments of the present invention the first load circuit may provide first and second impedances across the source and the drain of the first load transistor when the first sense signal is inactive and active, respectively. In other embodiments the Thevenin equivalent of the first impedance may be an open-circuit. The second impedance may be provided by a MOS diode having an anode electrically connected to the source of the first load transistor.

In still further embodiments of the present invention there may be a second load circuit that provides a variable impedance across the source and the drain of the second load transistor in response to at least a first sense signal.

As described above, a current sense amplifier circuit according to embodiments of the present invention may sense and amplify the voltage difference between a bit line and a complementary bit line by adjusting a current gain and is not limited by the voltage difference between a bit line and a complementary bit line provided by a bit line sense amplifier. In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:
1. A current sense amplifier, comprising:
first and second cross-coupled sensing transistors;
first and second data lines electrically coupled to a source of said first sensing transistor and a source of said second sensing transistor, respectively;
a first load transistor having a source electrically connected to a drain of said first sensing transistor and a gate of said second sensing transistor;
a second load transistor having a source electrically connected to a drain of said second sensing transistor and a gate of said first sensing transistor;
a switching transistor that is responsive to an enable signal and has a source electrically coupled to a drain of said first load transistor and a drain of said second load transistor; and
a first load circuit that provides a variable impedance across the source and the drain of said first load transistor, in response to at least a first sense signal.

2. A sense amplifier of claim 1,
wherein said first load circuit provides first and second impedances across the source and the drain of said first load transistor when the first sense signal is inactive and active, respectively.

3. A sense amplifier of claim 2, wherein a Thevenin equivalent of the first impedance is an open-circuit.

4. A sense amplifier of claim 2, wherein the second impedance is provided by a MOS diode having an anode electrically connected to the source of said first load transistor.

5. A sense amplifier of claim 3, wherein the second impedance is provided by a MOS diode having an anode electrically connected to the source of said first load transistor.

6. A current sense amplifier, comprising:
first and second cross-coupled PMOS transistors;
first and second data lines electrically coupled to a source of said first PMOS transistor and a source of said second PMOS transistor, respectively;
a first load transistor having a source electrically connected to a drain of said first PMOS transistor and a gate of said second PMOS transistor;
a second load transistor having a source electrically connected to a drain of said second PMOS transistor and a gate of said first PMOS transistor;
a switching transistor that is responsive to an enable signal and has a source electrically coupled to a drain of said first load transistor and a drain of said second load transistor;
a first load circuit that provides a variable impedance across the source and the drain of said first load transistor, in response to at least a first sense signal; and
a second load circuit that provides a variable impedance across the source and the drain of said second load transistor, in response to at least the first sense signal.

7. A sense amplifier of claim 6,
wherein said first load circuit provides first and second impedances across the source and the drain of said first load transistor when the first sense signal is inactive and active, respectively; and
wherein said second load circuit provides third and fourth impedances across the source and the drain of said second load transistor when the first sense signal is inactive and active, respectively.

8. A sense amplifier of claim 7, wherein a Thevenin equivalent of the first impedance and the third impedance is an open-circuit.

9. A sense amplifier of claim 7, wherein the second impedance is provided by a MOS diode having an anode electrically connected to the source of said first load transistor and wherein the second impedance is provided by a MOS diode having an anode electrically connected to the source of said second load transistor.

10. A sense amplifier of claim 6, wherein the second impedance is provided by a MOS diode having an anode electrically connected to the source of said first load transistor and wherein the second impedance is provided by a MOS diode having an anode electrically connected to the source of said second load transistor.

11. A current sense amplifier for sensing and amplifying memory cell data transmitted to a data input output line, the device comprising:

one sensing transistor having a source connected to the data input output line and the other sensing transistor having a source connected to a complementary data input output line, in which the gate and drain of one sensing transistor are cross-connected to those of the other sensing transistor, for sensing and amplifying the current difference between the data input output line and the complementary data input output line;

load resistors connected to the drains of the sensing transistors, respectively;

additional resistors each connected in parallel to both ends of each of the load resistors, for forming a current path in response to a sensing signal; and a switching transistor for flowing current in the data input output line and current in the complementary input output line to ground in response to a sensing enable signal.

12. The current sense amplifier of claim 11, wherein the load resistors are diode transistors.

13. The current sense amplifier of claim 11, wherein the additional resistors are transistors to the gates of which the sensing signal is connected.

14. The current sense amplifier of claim 11, wherein the sensing signal is a signal which is activated upon activation of a bit line sense amplifier, thus having a predetermined pulse width.

15. A current sense amplifier for sensing and amplifying memory cell data transmitted to a data input output line, the device comprising:

one sensing transistor having a source connected to the data input output line and the other sensing transistor having a source connected to a complementary data input output line, in which the gate and drain of one sensing transistor are cross-connected to those of the other sensing transistor, for sensing and amplifying the current difference between the data input output line and the complementary data input output line;

load resistors connected to the drains of the sensing transistors, respectively;

gain control units each connected between the drain of each of the sensing transistors and ground, the gain control units responding to first and second sensing signals;

additional resistors each connected to both ends of each of the load resistors, for forming a current path in response to the outputs of the gain control units; and a switching transistor for flowing current in the data input output line and current in the complementary input output line to ground in response to a sensing enable signal.

16. The current sense amplifier of claim 15, wherein each of the gain control units comprises:

a first transistor having a gate to which the first sensing signal is connected, and a drain connected to the drain of a sensing transistor; and a second transistor having a gate to which the second sensing signal is connected, a drain connected to the source of the first transistor, and a source connected to ground.

17. The current sense amplifier of claim 15, wherein the first sensing signal has a predetermined pulse width as the first sensing signal is activated upon activation of a bit line sense amplifier, and the second sensing signal is inverted to the first sensing signal.

18. The current sense amplifier of claim 15, wherein the load resistors are diode transistors.

19. The current sense amplifier of claim 15, wherein the additional resistors are transistors to the gates of which the outputs of the gain control units are connected.

20. A semiconductor memory device comprises:

a plurality of memory banks on each of which a plurality of memory cells are arranged;

bit line sense amplifiers for sensing and amplifying data of a bit line and data of a complementary bit line in the memory cells;

a column selection circuit for selecting the output of the bit line sense amplifier and transmitting the selected data to a data input output line and a complementary data input output line;

a load transistor unit for supplying current to the data input output line and the complementary data input output line according to the voltage levels of the data input output line and the complementary data input output line; and a current sense amplifier for sensing and amplifying the current difference between the data input output line and the complementary data input output line, wherein the current sense amplifier comprises:

one sensing transistor having a source connected to the data input output line and the other sensing transistor having a source connected to the complementary data input output line, in which the gate and drain of one sensing transistor are cross-connected to those of the other sensing transistor, for sensing and amplifying the current difference between the data input output line and the complementary data input output line;

load resistors connected to the drains of the sensing transistors, respectively;

additional resistors each connected in parallel to both ends of each of the load resistors, for forming a current path in response to a sensing signal; and a switching transistor for flowing current in the data input output line and current in the complementary input output line to ground in response to a sensing enable signal.

21. The semiconductor memory device of claim 20, wherein the sensing signal is generated in response to memory bank selection signals and the readout signal of a memory bank selected in response to the memory bank selection signals.

22. A semiconductor memory device comprises:

a plurality of memory banks on each of which a plurality of memory cells are arranged;

bit line sense amplifiers for sensing and amplifying data of a bit line and data of a complementary bit line in the memory cells;

a column selection circuit for selecting the output of the bit line sense amplifier and transmitting the selected data to a data input output line and a complementary data input output line;

a load transistor unit for supplying current to the data input output line and the complementary data input output line according to the voltage levels of the data input output line and the complementary data input output line; and a current sense amplifier for sensing and amplifying the current difference between the data input output line and the complementary data input output line, wherein the current sense amplifier comprises:

one sensing transistor having a source connected to the data input output line and the other sensing transistor having a source connected to the complementary data input output line, in which the gate and drain of one sensing transistor are cross-connected to those of the other sensing transistor, for sensing and amplifying the current difference between the data input output line and the complementary data input output line;

load resistors connected to the drains of the sensing transistors, respectively;

gain control units each connected between the drain of each of the sensing transistors and ground, the gain control units responding to first and second sensing signals;

additional resistors each connected in parallel to both ends of each of the load resistors, for forming a current path in response to the outputs of the gain control units; and a switching transistor for flowing current in the data input output line and current in the complementary input output line to ground in response to a sensing enable signal.

23. The semiconductor memory device of claim 22, wherein each of the gain control units comprises:

a first transistor having a gate to which the first sensing signal is connected, and a drain connected to the drain of a sensing transistor; and a second transistor having a gate to which the second sensing signal is connected, a drain connected to the source of the first transistor, and a source connected to ground.

24. The semiconductor memory device of claim 22, wherein the first sensing signal is generated in response to memory bank selection signals and the readout signal of a memory bank selected in response to the memory bank selection signals, and the second sensing signal is inverted to the first sensing signal.

* * * * *